(12) United States Patent
Lee et al.

(10) Patent No.: US 7,808,084 B1
(45) Date of Patent: Oct. 5, 2010

(54) SEMICONDUCTOR PACKAGE WITH HALF-ETCHED LOCKING FEATURES

(75) Inventors: Chang Deok Lee, Uijeongbu-si (KR); Do Hyun Na, Dongjak-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 269 days.

(21) Appl. No.: 12/116,127

(22) Filed: May 6, 2008

(51) Int. Cl.
 *H01L 23/495* (2006.01)
(52) U.S. Cl. .................. 257/666; 257/670; 257/676; 257/E23.031
(58) Field of Classification Search .............. 257/666, 257/670, 676, 784, 787, E23.031
See application file for complete search history.

(56) References Cited

U.S. PATENT DOCUMENTS

| 3,435,815 | A | 4/1969 | Forcier |
|---|---|---|---|
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |
| 4,727,633 | A | 3/1988 | Herrick |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Thien F Tran
(74) *Attorney, Agent, or Firm*—Stetlina Brunda Garred & Brucker

(57) ABSTRACT

Disclosed is a lead frame, a semiconductor device and a fabrication method related to the semiconductor device. Since the lead frame has a land connecting bar, an upper surface of which is half-etched, the land connecting bar is more easily removed by a blade than a conventional land connecting bar in a fabrication process for the semiconductor device. Accordingly, stress applied to the lands when the land connecting bar is removed is reduced, and a flatness of the lands is maintained. Also, first and second lands constituting the lands are alternately formed with the land connecting bar, leads are alternately formed with the second lands, and wire bonding regions of the leads are positioned on a plane higher than the second lands. Accordingly, an interval between the conductive wires can be constantly maintained and the conductive wires have different traces, thus preventing a short between the conductive wires due to wire sweeping in an encapsulation process.

21 Claims, 12 Drawing Sheets

U.S. PATENT DOCUMENTS

| | | |
|---|---|---|
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |

| | | | | | | |
|---|---|---|---|---|---|---|
| 6,143,981 | A | 11/2000 | Glenn | 6,414,385 B1 | 7/2002 | Huang et al. |
| 6,150,709 | A | 11/2000 | Shin et al. | 6,420,779 B1 | 7/2002 | Sharma et al. |
| 6,157,074 | A | 12/2000 | Lee | 6,421,013 B1 | 7/2002 | Chung |
| 6,166,430 | A | 12/2000 | Yamaguchi | 6,423,643 B1 | 7/2002 | Furuhata et al. |
| 6,169,329 | B1 | 1/2001 | Farnworth et al. | 6,429,508 B1 | 8/2002 | Gang |
| 6,177,718 | B1 | 1/2001 | Kozono | 6,437,429 B1 | 8/2002 | Su et al. |
| 6,181,002 | B1 | 1/2001 | Juso et al. | 6,444,499 B1 | 9/2002 | Swiss et al. |
| 6,184,465 | B1 | 2/2001 | Corisis | 6,448,633 B1 | 9/2002 | Yee et al. |
| 6,184,573 | B1 | 2/2001 | Pu | 6,452,279 B2 | 9/2002 | Shimoda |
| 6,194,777 | B1 | 2/2001 | Abbott et al. | 6,459,148 B1 | 10/2002 | Chun-Jen et al. |
| 6,197,615 | B1 | 3/2001 | Song et al. | 6,464,121 B2 | 10/2002 | Reijnders |
| 6,198,171 | B1 | 3/2001 | Huang et al. | 6,465,883 B2 | 10/2002 | Olofsson |
| 6,201,186 | B1 | 3/2001 | Daniels et al. | 6,472,735 B2 | 10/2002 | Isaak |
| 6,201,292 | B1 | 3/2001 | Yagi et al. | 6,475,646 B2 | 11/2002 | Park et al. |
| 6,204,554 | B1 | 3/2001 | Ewer et al. | 6,476,469 B2 | 11/2002 | Hung et al. |
| 6,208,020 | B1 | 3/2001 | Minamio et al. | 6,476,474 B1 | 11/2002 | Hung |
| 6,208,021 | B1 | 3/2001 | Ohuchi et al. | 6,482,680 B1 | 11/2002 | Khor et al. |
| 6,208,023 | B1 | 3/2001 | Nakayama et al. | 6,483,178 B1 | 11/2002 | Chuang |
| 6,211,462 | B1 | 4/2001 | Carter, Jr. et al. | 6,492,718 B2 | 12/2002 | Ohmori |
| 6,218,731 | B1 | 4/2001 | Huang et al. | 6,495,909 B2 | 12/2002 | Jung et al. |
| 6,222,258 | B1 | 4/2001 | Asano et al. | 6,498,099 B1 | 12/2002 | McClellan et al. |
| 6,222,259 | B1 | 4/2001 | Park et al. | 6,498,392 B2 | 12/2002 | Azuma |
| 6,225,146 | B1 | 5/2001 | Yamaguchi et al. | 6,507,096 B2 | 1/2003 | Gang |
| 6,229,200 | B1 | 5/2001 | McClellan et al. | 6,507,120 B2 | 1/2003 | Lo et al. |
| 6,229,205 | B1 | 5/2001 | Jeong et al. | 6,518,089 B2 | 2/2003 | Coyle |
| 6,238,952 | B1 | 5/2001 | Lin et al. | 6,525,942 B2 | 2/2003 | Huang et al. |
| 6,239,367 | B1 | 5/2001 | Hsuan et al. | 6,528,893 B2 | 3/2003 | Jung et al. |
| 6,239,384 | B1 | 5/2001 | Smith et al. | 6,534,849 B1 | 3/2003 | Gang |
| 6,242,281 | B1 | 6/2001 | McClellan et al. | 6,545,332 B2 | 4/2003 | Huang |
| 6,256,200 | B1 | 7/2001 | Lam et al. | 6,545,345 B1 | 4/2003 | Glenn et al. |
| 6,258,629 | B1 | 7/2001 | Niones et al. | 6,552,421 B2 | 4/2003 | Kishimoto et al. |
| 6,261,864 | B1 | 7/2001 | Jung et al. | 6,559,525 B2 | 5/2003 | Huang |
| 6,281,566 | B1 | 8/2001 | Magni | 6,566,168 B2 | 5/2003 | Gang |
| 6,282,094 | B1 | 8/2001 | Lo et al. | 6,580,161 B2 | 6/2003 | Kobayakawa |
| 6,282,095 | B1 | 8/2001 | Houghton et al. | 6,583,503 B2 | 6/2003 | Akram et al. |
| 6,285,075 | B1 | 9/2001 | Combs et al. | 6,585,905 B1 | 7/2003 | Fan et al. |
| 6,291,271 | B1 | 9/2001 | Lee et al. | 6,603,196 B2 | 8/2003 | Lee et al. |
| 6,291,273 | B1 | 9/2001 | Miyaki et al. | 6,624,005 B1 | 9/2003 | DiCaprio et al. |
| 6,294,100 | B1 | 9/2001 | Fan et al. | 6,627,977 B1 | 9/2003 | Foster |
| 6,294,830 | B1 | 9/2001 | Fjelstad | 6,646,339 B1 | 11/2003 | Ku |
| 6,295,977 | B1 | 10/2001 | Ripper et al. | 6,667,546 B2 | 12/2003 | Huang et al. |
| 6,297,548 | B1 | 10/2001 | Moden et al. | 6,677,663 B1 | 1/2004 | Ku et al. |
| 6,303,984 | B1 | 10/2001 | Corisis | 6,686,649 B1 | 2/2004 | Matthews et al. |
| 6,303,997 | B1 | 10/2001 | Lee | 6,696,752 B2 | 2/2004 | Su et al. |
| 6,306,685 | B1 | 10/2001 | Liu et al. | 6,700,189 B2 | 3/2004 | Shibata |
| 6,307,272 | B1 | 10/2001 | Takahashi et al. | 6,713,375 B2 | 3/2004 | Shenoy |
| 6,309,909 | B1 | 10/2001 | Ohgiyama | 6,757,178 B2 | 6/2004 | Okabe et al. |
| 6,316,822 | B1 | 11/2001 | Venkateshwaran et al. | 6,800,936 B2 | 10/2004 | Kosemura et al. |
| 6,316,838 | B1 | 11/2001 | Ozawa et al. | 6,812,552 B2 | 11/2004 | Islam et al. |
| 6,323,550 | B1 | 11/2001 | Martin et al. | 6,818,973 B1 | 11/2004 | Foster |
| 6,326,243 | B1 | 12/2001 | Suzuya et al. | 6,858,919 B2 | 2/2005 | Seo et al. |
| 6,326,244 | B1 | 12/2001 | Brooks et al. | 6,867,492 B2 | 3/2005 | Auburger et al. |
| 6,326,678 | B1 | 12/2001 | Karnezos et al. | 6,876,068 B1 | 4/2005 | Lee et al. |
| 6,335,564 | B1 | 1/2002 | Pour | 6,878,571 B2 | 4/2005 | Isaak et al. |
| 6,337,510 | B1 | 1/2002 | Chun-Jen et al. | 6,897,552 B2 | 5/2005 | Nakao |
| 6,339,252 | B1 | 1/2002 | Niones et al. | 6,927,478 B2 | 8/2005 | Paek |
| 6,339,255 | B1 | 1/2002 | Shin | 6,967,125 B2 | 11/2005 | Fee et al. |
| 6,342,730 | B1 | 1/2002 | Jung et al. | 6,995,459 B2 | 2/2006 | Lee et al. |
| 6,348,726 | B1 | 2/2002 | Bayan et al. | 7,002,805 B2 | 2/2006 | Lee et al. |
| 6,355,502 | B1 | 3/2002 | Kang et al. | 7,005,327 B2 | 2/2006 | Kung et al. |
| 6,359,221 | B1 | 3/2002 | Yamada et al. | 7,015,571 B2 | 3/2006 | Chang et al. |
| 6,362,525 | B1 | 3/2002 | Rahim | 7,045,396 B2 | 5/2006 | Crowley et al. |
| 6,369,447 | B2 | 4/2002 | Mori | 7,053,469 B2 | 5/2006 | Koh et al. |
| 6,369,454 | B1 | 4/2002 | Chung | 7,075,816 B2 | 7/2006 | Fee et al. |
| 6,373,127 | B1 | 4/2002 | Baudouin et al. | 7,102,209 B2 | 9/2006 | Bayan et al. |
| 6,377,464 | B1 | 4/2002 | Hashemi et al. | 7,109,572 B2 | 9/2006 | Fee et al. |
| 6,380,048 | B1 | 4/2002 | Boon et al. | 7,185,426 B1 | 3/2007 | Hiner et al. |
| 6,384,472 | B1 | 5/2002 | Huang | 7,193,298 B2 | 3/2007 | Hong et al. |
| 6,388,336 | B1 | 5/2002 | Venkateshwaran et al. | 7,211,471 B1 | 5/2007 | Foster |
| 6,395,578 | B1 | 5/2002 | Shin et al. | 7,245,007 B1 | 7/2007 | Foster |
| 6,399,415 | B1 | 6/2002 | Bayan et al. | 7,253,503 B2 | 8/2007 | Fusaro et al. |
| 6,400,004 | B1 | 6/2002 | Fan et al. | 2001/0008305 A1 | 7/2001 | McClellan et al. |
| 6,410,979 | B2 | 6/2002 | Abe | 2002/0024122 A1 | 2/2002 | Jung et al. |

| | | |
|---|---|---|
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0097016 A1 | 5/2004 | Yee et al. |
| 2004/0164387 A1 | 8/2004 | Ikenaga et al. |
| 2004/0253803 A1 | 12/2004 | Tomono et al. |
| 2005/0199987 A1 | 9/2005 | Danno et al. |
| 2006/0087020 A1 | 4/2006 | Hirano et al. |
| 2006/0157843 A1 | 7/2006 | Hwang |
| 2006/0231939 A1 | 10/2006 | Kawabata et al. |
| 2007/0023202 A1 | 2/2007 | Shibata |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2008 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064634 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 2001060648 | 3/2001 |
| JP | 2002519848 | 7/2002 |
| JP | 2002043497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

SEMICONDUCTOR PACKAGE WITH HALF-ETCHED LOCKING FEATURES

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

Aspects of the present invention relate to a lead frame, a semiconductor device and a fabricating method related thereto.

2. Description of the Related Art

In general, a lead frame for a semiconductor device is fabricated by performing a mechanical stamping or chemical etching process with respect to a metal strip. The lead frame for a semiconductor device simultaneously serves as a lead for connecting a semiconductor die to an external circuit and as a frame for fixing a semiconductor device to an external device.

Lead frames for semiconductor devices may be classified into a copper lead frame (copper:iron:phosphorus=99.8:0.01:0.025), a copper alloy lead frame (copper:chrome:tin:zinc=99:0.25:0.25:0.22), an alloy-42 lead frame (iron:nickel=58:42), and the like. Semiconductor devices using such lead frames are used for a dual inline package (DIP) using a through-hole mounting method, a quad flat package (QFP) and a small outline package (SOP) using a surface mounting method, and the like.

However, since leads with a predetermined length protrude to the outside through the side of an encapsulant, the size of a semiconductor device increases and the number of input/output pins is small. That is, as state of the art semiconductor dies have been highly integrated and multi-functional, a large number of input/output pins are required, but it is difficult to satisfy such requirements with the lead frame.

In order to solve this problem, there has been developed a semiconductor device used for a ball grid array (BGA) or pin grid array package using a laminate, tape or film type circuit board. Since, in these semiconductor devices, a plurality of solder balls or metal pins are not area-arrayed on the side of an encapsulant but rather are on a bottom of the encapsulant (i.e., a bottom of a circuit board), such semiconductor devices can provide a relatively large number of input/output pins.

However, such semiconductor devices have high-priced circuit boards and a lower dissipation and electrical performance than semiconductor devices using lead frames. That is, since a semiconductor die is directly mounted on a die pad formed of a copper material, the semiconductor devices using lead frames have an excellent dissipation performance. Also, since the die pad uses itself as a ground region for a signal lead, the semiconductor devices using lead frames can enhance electrical performance. However, semiconductor devices using circuit boards generally are incapable of providing the same advantages.

BRIEF SUMMARY OF THE INVENTION

In accordance with the present invention, there is provided a lead frame, a semiconductor device and a fabrication method related to the semiconductor device. Since the lead frame has a land connecting bar, an upper surface of which is half-etched, the land connecting bar is more easily removed by a blade than a conventional land connecting bar in a fabrication process for the semiconductor device. Accordingly, stress applied to the lands when the land connecting bar is removed is reduced, and a flatness of the lands is maintained. Also, first and second lands constituting the lands are alternately formed with the land connecting bar, leads are alternately formed with the second lands, and wire bonding regions of the leads are positioned on a plane higher than the second lands. Accordingly, an interval between the conductive wires can be constantly maintained and the conductive wires have different traces, thus preventing a short between the conductive wires due to wire sweeping in an encapsulation process.

The present invention will be more apparent from the following detailed description taken in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and the detailed description to indicate the same elements.

DETAILED DESCRIPTION OF THE INVENTION

Figure 1A:
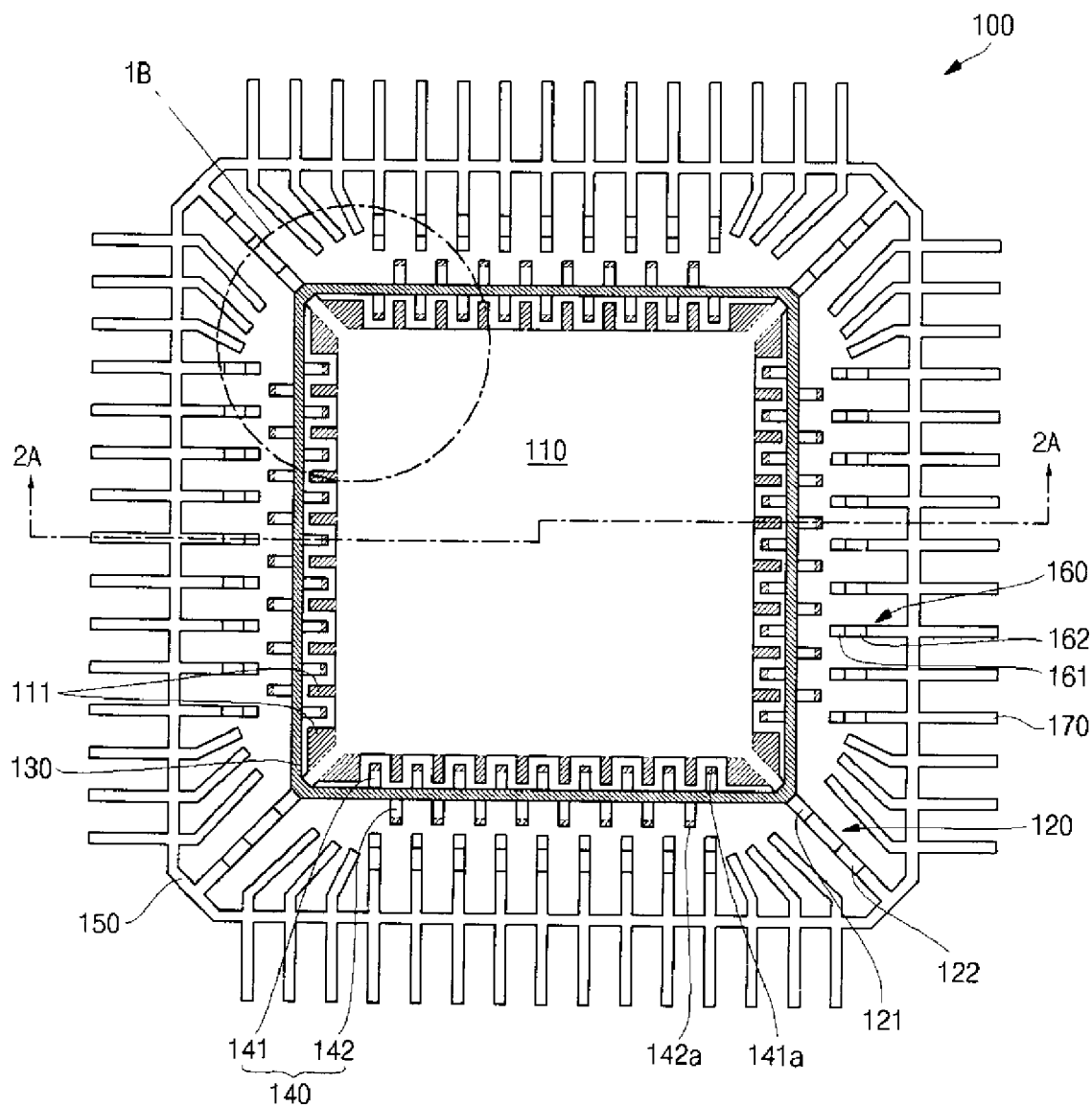
FIG. 1A is a top plan view showing a lead frame according to a first embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the Figures.

Figure 1B:
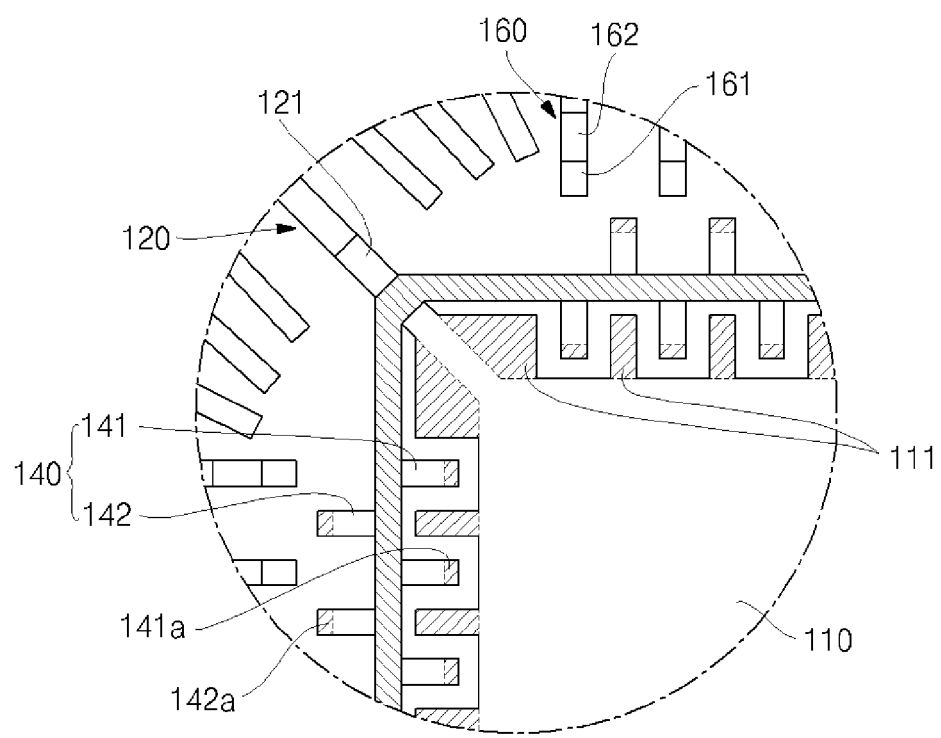
FIG. 1B is an enlarged view of 1B in FIG. 1A.
Figure 2A:
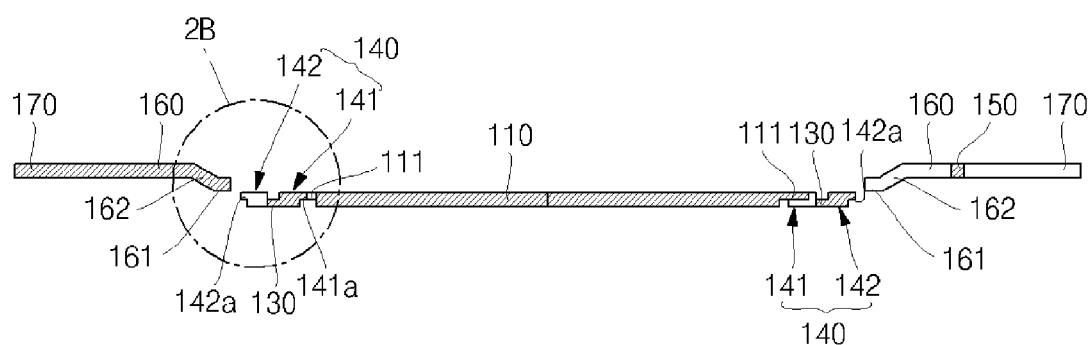
FIG. 2A is a cross-sectional view taken along line 2A-2A in FIG. 1A.
Figure 2B:
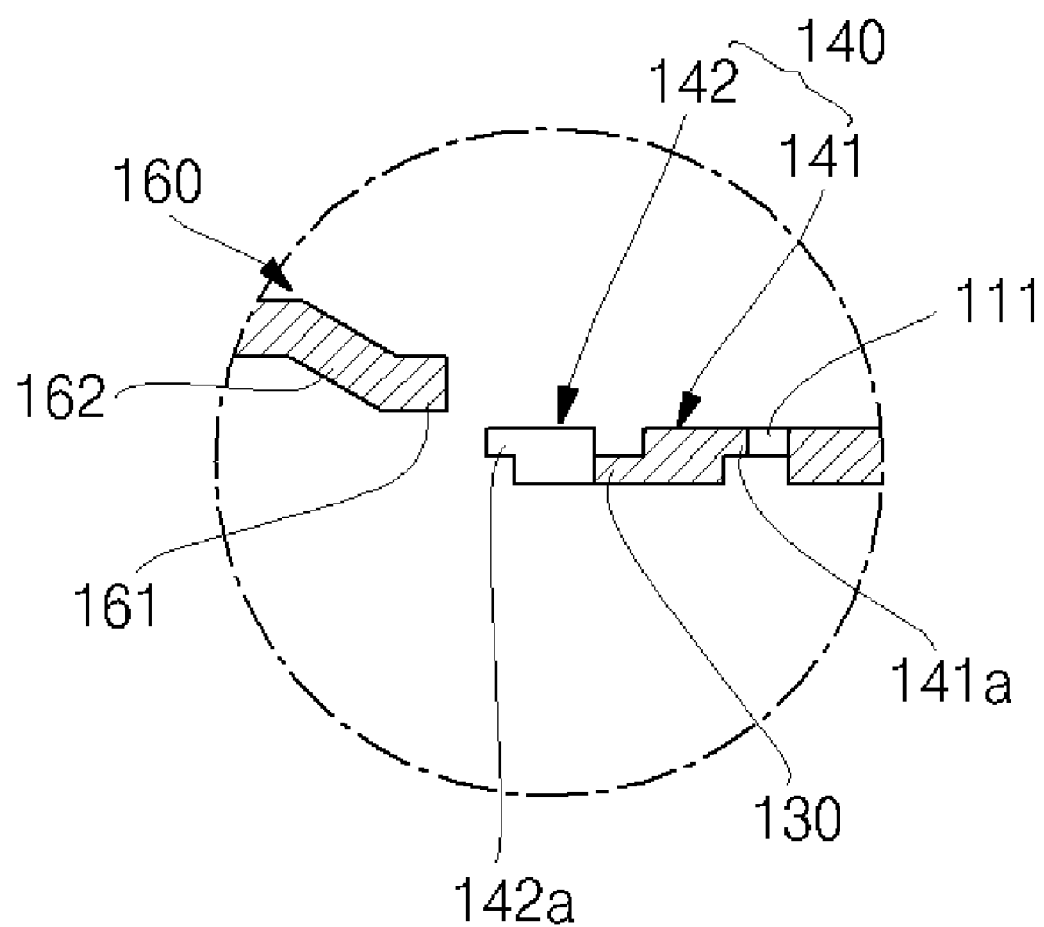
FIG. 2B is an enlarged view of 2B in FIG. 2A.

Referring to FIG. 1A, a lead frame according to an embodiment of the present invention is shown as a plan view. Referring to FIG. 1B, an enlarged view of 1B in FIG. 1A is shown. FIG. 2A is a cross-sectional view taken along line 2A-2A in FIG. 1A. FIG. 2B is an enlarged view of 2B in FIG. 2A.

As shown in FIGS. 1A and 1B, the lead frame 100 according to the embodiment of the present invention includes a die pad 110; a plurality of tie bars 120 formed around the die pad 110; a land connecting bar 130 connected to one end of the tie bars 120; a plurality of lands 140 formed at sides of the land connecting bar 130; a dambar 150 connected to the other ends of the tiebars 120; a plurality of leads, each of which includes a first portion 160 protruding in the direction of the die pad 110 from the dambar 150 and a second portion 170 extending outwardly from the dambar 150 in alignment with the corresponding first portion 160.

The die pad 110 is formed roughly in the shape of a rectangular plate to have four sides and four corners. In the fabrication process of the semiconductor device, an adhesive is coated on the die pad 110, and a semiconductor die is attached on the die pad 110.

Also, the die pad 110 may have locking projections 111 protruding outwardly at a predetermined length from the respective sides and corners thereof. A lower surface of each of the locking projections 111 may be half-etched. In FIG. 1A, the locking projections 111 having the half-etched lower surfaces are indicated as hatching. Therefore, when encapsulation is performed in a subsequent process, lower portions of the locking projections 111 are covered with an encapsulant, thus enhancing adhesion between the die pad 110 and the encapsulation.

The tie bars 120 protrude outwardly from the four corners of the die pad 110. That is, the tie bars 120 extend outwardly and diagonally from the respective corners of the die pad 110. First and second downsets 121 and 122, bent upwardly are formed in each of the tie bars 120. Hence, an outer portion of the first downset 121 in each of the tie bars 120 is positioned higher than the die pad 110. That is, only an inner portion of the first downset 121 in each of the tie bars 120 extends in the same plane as the die pad 110.

The land connecting bar 130 is positioned at one end of the tie bars 120, and the respective tie bars 120 are connected to one another through the land connecting bar 130. The land connecting bar 130 is formed roughly in the shape of a quadrangular ring with four sides and four corners. Also, the land connecting bar 130 is formed to be roughly in parallel with respective sides of the die pad 110 and to surround the die pad 110.

As shown in FIGS. 1A and 1B, an upper surface of the land connecting bar 130 is half-etched. In FIG. 1A, the land connecting bar 130 having the half-etched upper surface is indicated as hatching. The hatching of the land connecting bar 130 is indicated in a different form from the hatching of the locking projections 111 in the die pad 110.

That is, since the upper surface of the land connecting bar 130 is half-etched to have a relatively thinner thickness than other portions, it is easily removed by a blade in a subsequent process. Accordingly, when the land connecting bar 130 is removed, it is possible to reduce stress applied to the lands 140. As a result, it is possible to solve a problem regarding the flatness of lands being deviated or distorted due to stress applied when a conventional land connecting bar is removed.

The lands 140 are formed at a side of the land connecting bar 130 therealong. Also, the lands 140 are arranged in a zigzag form with respect to the land connecting bar 130. Each of the lands 140 may include first and second lands 141 and 142 protruding in opposite directions in an offset relationship to each other from the land connecting bar 130.

The first lands 141 have a predetermined pitch from the land connecting bar 130 and protrude in the direction of the die pad 110. Also, the first lands 141 may be formed to alternate with the locking projections 111 as shown, though being spaced apart from the locking projections 111 of the die pad 110. By arranging the first lands 141 as described above, the first lands 141 are formed close to the die pad 110, thus reducing the length of conductive wires to be bonded to the first lands 141. Each of the first lands 141 has a lower surface and an end portion, and a locking projection 141a which is defined by forming a half-etched portion in the lower surface at the end portion thereof. Thus, since an encapsulant covers the locking projection 141a when an encapsulation process is performed, adhesion between the first lands 141 and the encapsulant increases.

The second lands 142 have a predetermined pitch from the land connecting bar 130 and protrude in the direction of the dambar 150. Also, the second lands 142 are formed to correspond to and be aligned with respective spaces between the first lands 141. That is, the second lands 142 are alternately formed with the first lands 141. By arranging the second lands 142 as described above, an interval between conductive wires for connecting the first and second lands 141 and 142 to a semiconductor die is constantly maintained, thus preventing a short between the conductive wires due to wire sweeping in the encapsulation process. Each of the second lands 142 has a lower surface and an end portion, and a locking projection 142a which is defined by forming a half-etched portion in the lower surface at the end portion thereof. Thus, since an encapsulant covers the locking projection 142a when an encapsulation process is performed, adhesion between the second lands 142 and the encapsulant increases.

The dambar 150 connects the other ends of the tie bars 120 to one another. Hence, the dambar 150 is formed roughly in the shape of a quadrangular ring. The dambar 150 is formed to be roughly in parallel with respective sides of the die pad 110. However, the dambar 150 is removed such that the normal leads 160 are electrically isolated from one another in a fabrication process for a semiconductor device which will be described in more detail below.

The first portion 160 of the leads are perpendicular to the dambar 150 and extend toward the die pad 110 in a predetermined length. Also, the first portions 160 are alternately positioned to be arranged with the second lands 142 while being spaced apart from the second lands 142. Each of the first portions 160 has a wire bonding region 161 formed flat to have a predetermined pitch at an end thereof. As shown in FIGS. 2A and 2B, the wire bonding regions 161 are positioned on a different plane from the lands 140. That is, since the wire bonding regions 161 are positioned higher than the lands 140, the wire bonding regions 161 are encapsulated by an encapsulant such that they are not exposed to the outside when an encapsulation process is performed.

The wire bonding regions 161 are electrically connected to a semiconductor die through conductive wires in a subsequent process. As described above, the first portions 160 are alternately positioned with the second lands 142 while corresponding to the first lands 141. Thus, conductive wires connected to the wire bonding regions 161 have different traces such that they do not come into contact with those connected to the first lands 141. In addition, gold or silver may be plated onto the wire bonding regions 161 such that wire bonding is easily performed.

Each of the first portions 160 of the leads has a downset 162 extending to the wire bonding region 161 and bent upwardly. The dambar 150 and second portions 170 of the leads are positioned on a plane formed higher than the wire bonding regions 161 of the first portions 160 of the leads.

The second portions 170 of the leads are perpendicular to the dambar 150 and correspond to the first portions 160. Also, the second portions 170 extend outwardly at a predetermined length. It will be apparent that the second portions 170 are electrically connected to the tie bars 120 and the first portions 160. However, since portions of the dambar 150 extending between the leads are removed in the fabrication process of the semiconductor device, the second portions 170 of each of the leads are electrically connected to only corresponding ones of the first portions 160 in the semiconductor device.

Hence, electrical signals through the first portions 160 are transmitted to an external device through the second portions 170. It will be apparent that the second portions 170 are subjected to surface or through-hole mounting onto the external device through the side of the encapsulant by solder or the like.

As described above, in the lead frame 100 of the present invention, an upper portion of the land connecting bar 130 is half-etched, so that sawing is easily performed with a blade. Accordingly, when the land connecting bar 130 is removed, stress applied to the lands 140 is reduced, thus maintaining the flatness of the lands 140. Also, in the lead frame 100 of the present invention, the first lands 141, second lands 142 and normal leads 160 are alternately formed to be arranged with one another while being spaced apart from one another, and the wire bonding regions 161 of the normal leads 160 are formed higher than the second lands 142. Accordingly, an interval between conductive wires is constantly maintained, thus preventing a short between the conductive wires due to wire sweeping in the encapsulation process.

Hereinafter, a configuration of a semiconductor device according to an embodiment of the present invention will be described.

Figure 3A:
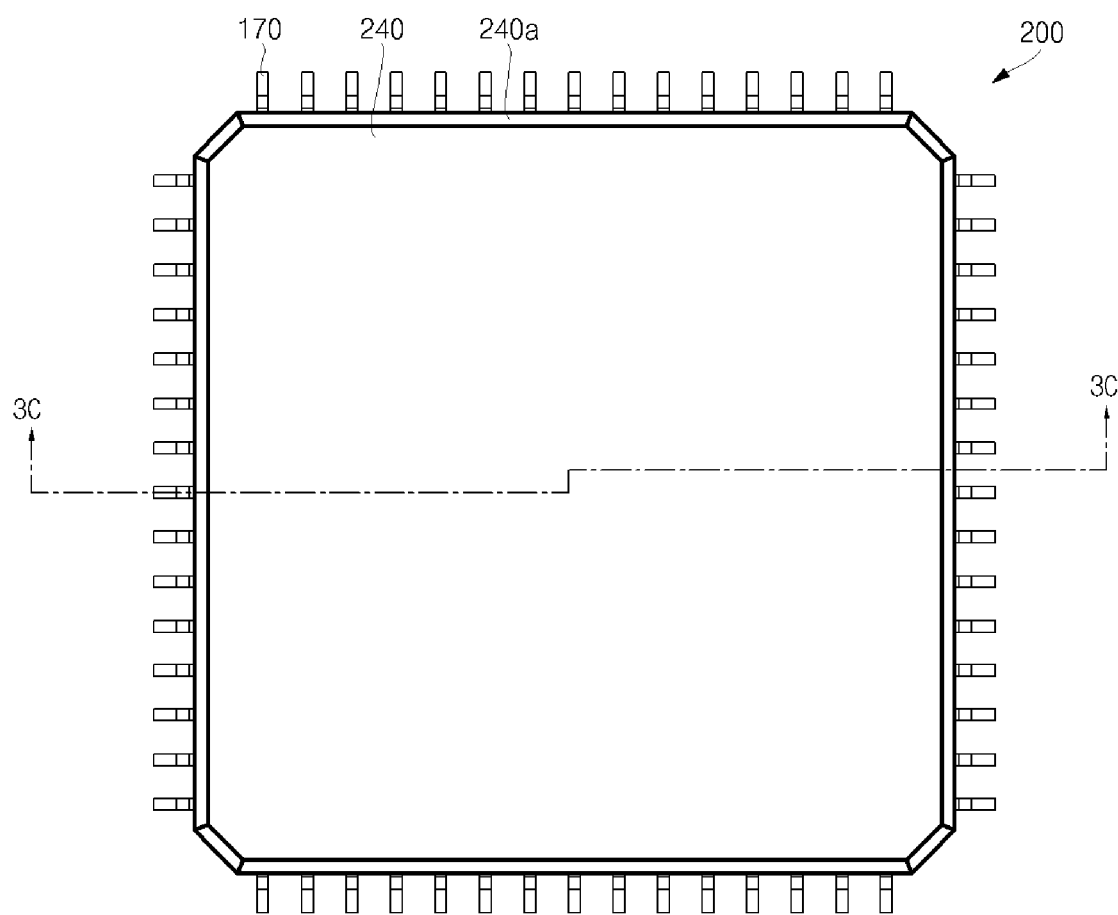
FIG. 3A is a top plan view showing a semiconductor device fabricated in accordance with an embodiment of the present invention.
Figure 3B:
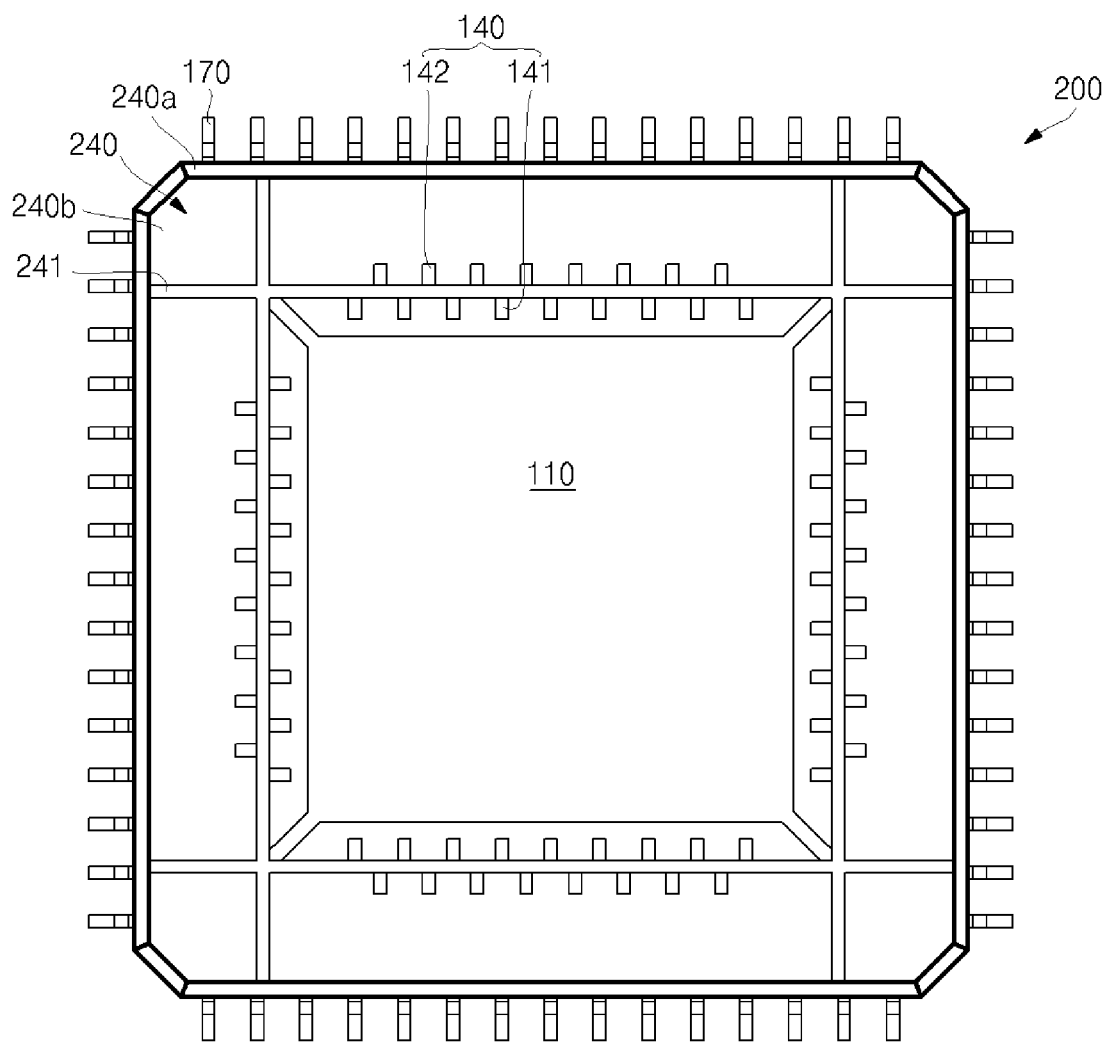
FIG. 3B is a bottom view of the semiconductor device shown in FIG. 3A.
Figure 3C:
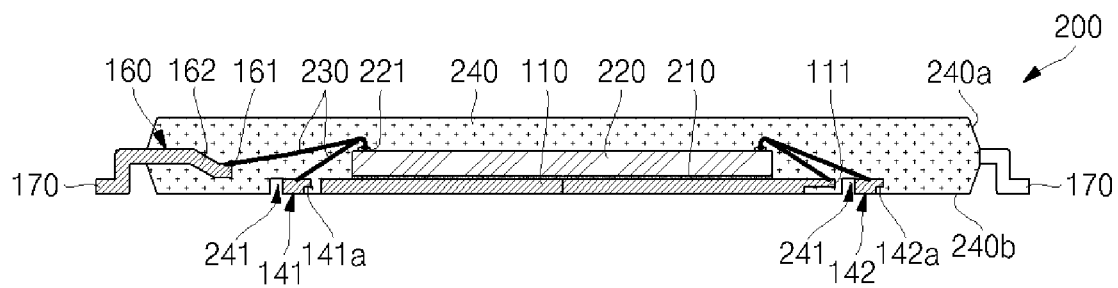
FIG. 3C is a cross-sectional view taken along line 3C-3C in FIG. 3A.

Referring to FIG. 3A, a semiconductor package or semiconductor device 200 according to an embodiment of the present invention is shown as a plan view. Referring to FIG. 3B, the semiconductor device 200 is shown as a rear view. Referring to FIG. 3C, a cross-section view taken along line 3C-3C in FIG. 3A is shown. Like reference numerals are used to designate like elements having the same structures and functions, and the different configurations from the aforementioned lead frame 100 will be mainly described below.

As shown in FIGS. 3A-3C, the semiconductor device 200 includes a lead frame 100, an adhesive 210, a semiconductor die 220, conductive wires 230 and an encapsulant 240. The lead frame 100 includes a die pad 110, tie bars 120, lands 140, and leads which each include a first portion 160 and a second portion 170. That is, the lead frame 100 is provided in the state that a land connecting bar 130 and a dambar 150 are removed in the semiconductor device 200. Since the lead frame 100 has been described above, further description of the lead frame 100 in the context of the semiconductor device 200 will be omitted.

The adhesive 210 is formed on the die pad 110 of the lead frame 100. The adhesive 210 generally includes any one selected from a liquid epoxy adhesive, an adhesive film, an adhesive tape and an equivalent thereof. The semiconductor die 220 is attached to the adhesive 210. A plurality of bond pads 221 are formed on an upper surface of the semiconductor die 220. The conductive wires 230 electrically connect the bond pads 221 of the semiconductor die 220 to first lands 141, the bond pads 221 to second lands 142, and the bond pads 221 to wire bonding regions 161 of the normal leads 160.

As described above, the first lands 141, second lands 142 and wire bonding regions 161 of the first portions 160 of the leads are alternately formed, and the wire bonding regions 161 are positioned higher than the first and second lands 141 and 142. Accordingly, an interval between the conductive wires 230 can be constantly maintained and a short between the conductive wires 230 can be prevented by changing a loop height.

The package body or encapsulant 240 encapsulates the lead frame 100, the adhesive 210, the semiconductor die 220 and the conductive wires 230 to protect them from the external environment. The second portions 170 of the leads in the lead frame 100 are extended and bent toward the outside through a side portion 240a of the encapsulant 240 to be of a predetermined length. Although the second portions 170 are bent outwardly from the encapsulant 240 in FIG. 3C, they may be bent inwardly from the encapsulant 240. The first and second lands 141 and 142 in the lead frame 100 are exposed to the outside through a lower portion of the encapsulant 240.

A groove 241 is formed in the lower portion 240b of the encapsulant 240 by a blade. The groove 241 has two rows formed in parallel with each other and two columns formed perpendicular to the rows. Also, the groove 241 is formed to correspond to the land connecting bar 130. The groove 241 is formed by grinding and removing the land connecting bar 130 with the blade. The groove 241 is formed such that the first and second lands 141 and 142 are electrically isolated from each other.

As described above, the semiconductor device 200 includes lands 141 having the first and second lands 141 and 142 alternately arranged along sides of the die pad 110. Also, the semiconductor device 200 includes leads having first portions 160 formed on a plane different from the second lands 142 and alternately formed with the second lands 142. Thus, in the semiconductor device 200 of the present invention, an interval between the conductive wires 230 connected to the first lands 141, second lands 142 and wire bonding regions 161 of the first portions 160 of the leads can be constantly maintained, and the conductive wires 230 can be formed to have different traces. Accordingly, the semiconductor device 200 of the present invention can prevent a short between the conductive wires 230.

Hereinafter, a fabrication method for a semiconductor device according to an embodiment of the present invention will be described.

Figure 4:
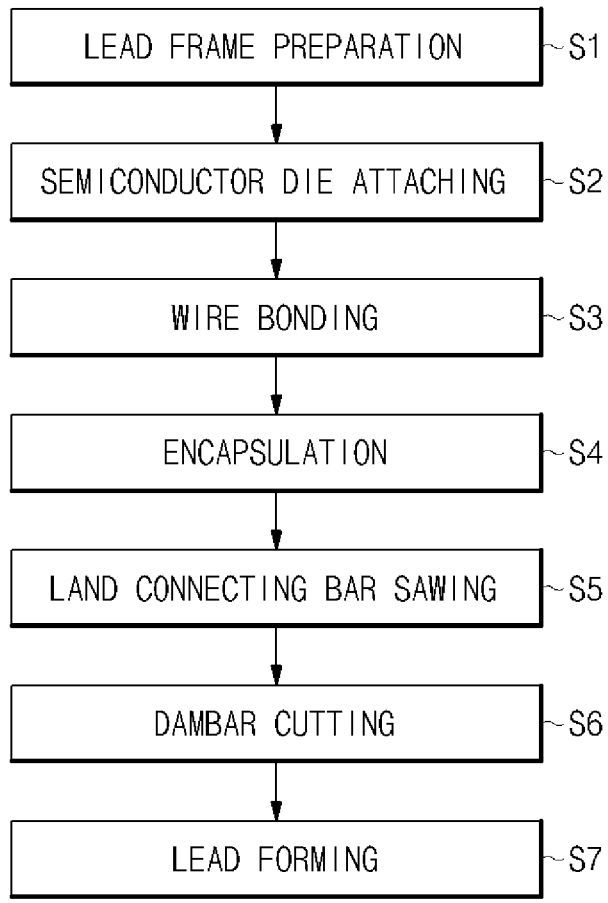
FIG. 4 is a flowchart illustrating a fabrication method of a semiconductor device according to the present invention.

Referring to FIG. 4, an exemplary fabrication method for the semiconductor device 200 of the present invention is shown as a flowchart. Referring to FIGS. 5A to 5K, the fabrication method of the semiconductor device 200 of the present invention is shown in cross-sectional and plan views.

As shown in FIG. 4, the fabrication method for the semiconductor device 200 includes a lead frame preparation step (S1), a semiconductor die attaching step (S2), a wire bonding step (S3), an encapsulation step (S4), a land connecting bar sawing step (S5), a dambar cutting step (S6) and a lead forming step (S7). Hereinafter, the respective steps in FIG. 4 will be described with reference to FIGS. 5A to 5K.

Figure 5A:
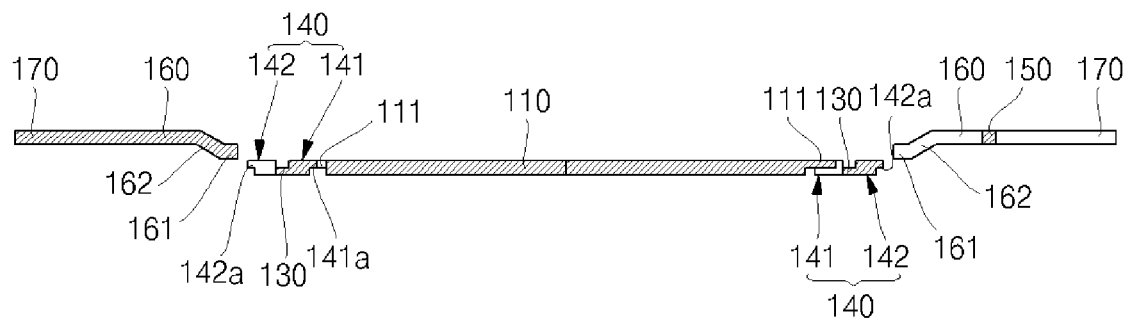
FIGS. 5A to 5K are views illustrating the fabrication method of a semiconductor device according to the present invention.

As shown in FIGS. 4 and 5A, in the lead frame preparation step (S1), a lead frame 100 is prepared, which includes a die pad 110; a plurality of tie bars (not shown) formed around the die pad 110; a land connecting bar 130 connected to one ends of the tie bars and having a half-etched upper surface; lands 140 alternately arranged with respect to the land connecting bar 130; a dambar 150 connected to the other ends of the tie bars; a plurality of leads which each include a first portion 160 formed at one side of the dambar 150 and a second portion 170 formed at the opposite side of the dambar 150. Since the structure of the lead frame 100 has been already described in detail above, a detailed descriptions of such lead frame 100 is not repeated in relation to FIG. 5A.

Figure 5B:
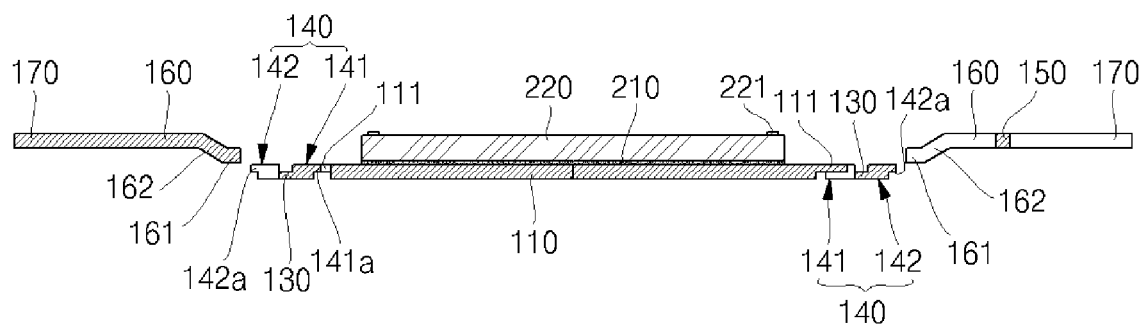

As shown in FIGS. 4 and 5B, in the semiconductor die attaching step (S2), a semiconductor die 220 having a plurality of bond pads 221 formed on an upper surface thereof is attached on the die pad 110 in the lead frame 100 using an adhesive 210. The adhesive 210 generally includes any one selected from a liquid epoxy adhesive, an adhesive film, an adhesive tape and an equivalent thereof. However, the present invention is not intended to be limited to any particular type of adhesive 210.

Figure 5C:
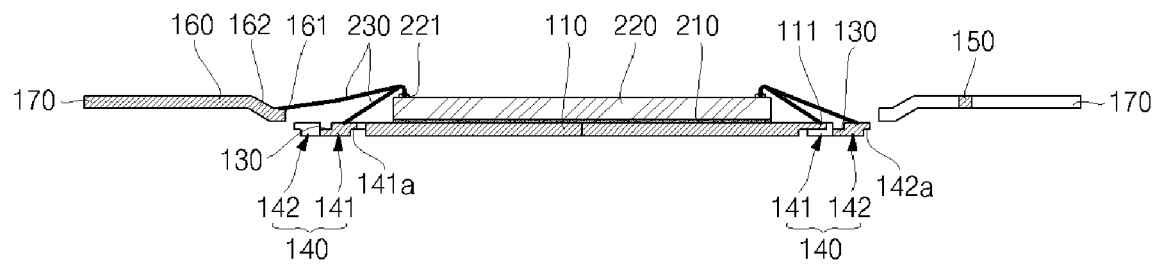
Figure 5D:
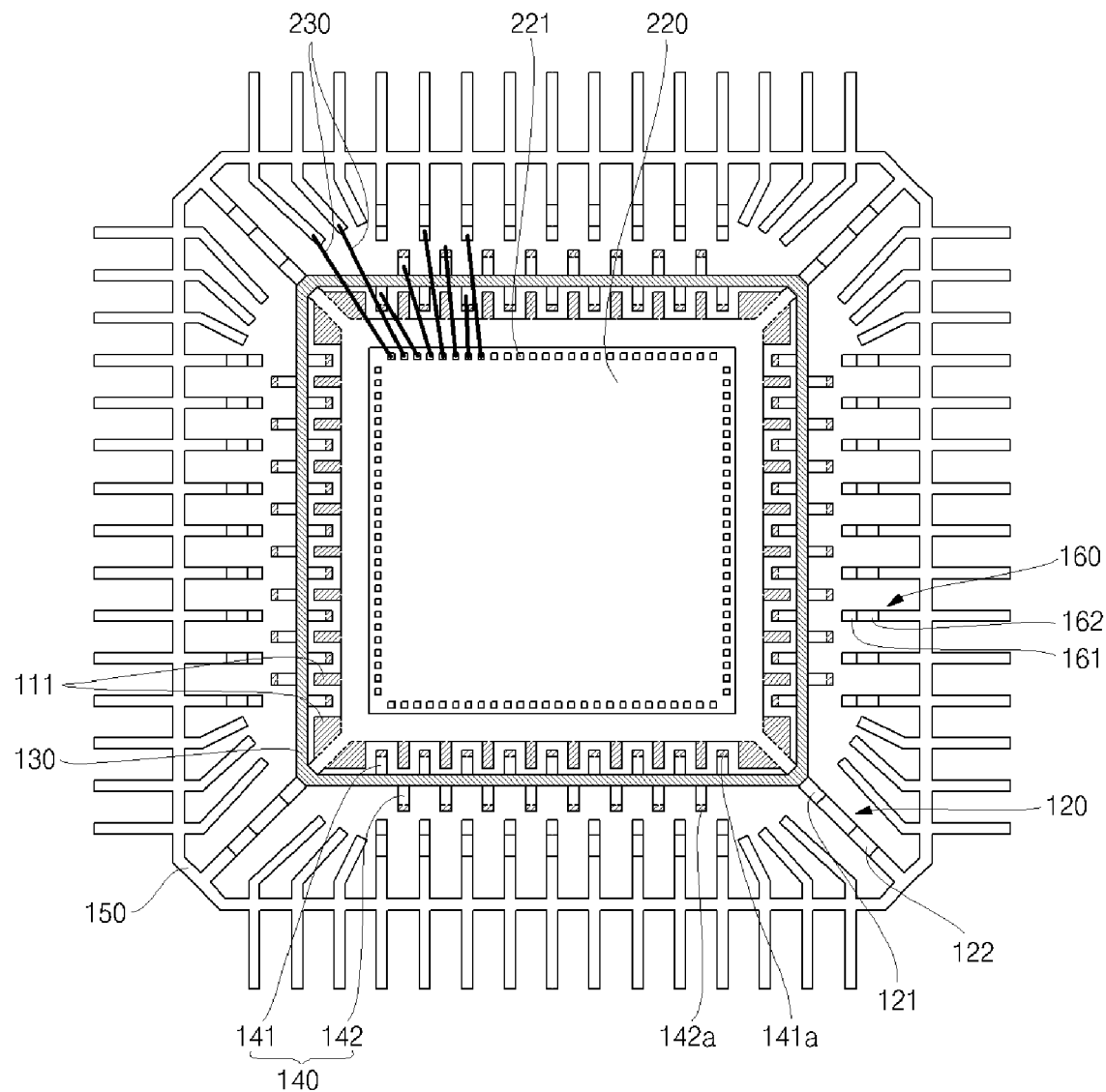

As shown in FIGS. 4, 5C and 5D, in the wire bonding step (S3), the semiconductor die 220 and the lead frame 100 are electrically connected to each other using conductive wires 230. That is, the conductive wires 230 connect the bond pads 221 of the semiconductor die 220 to the lands 140, and the bond pads 221 of the semiconductor die 220 to wire bonding regions 161 of the first portions 160 of the leads. As described above, the first and second lands 141 and 142 of the lands 140 and the wire bonding regions 161 of the first portions 160 of the leads are alternately arranged. Since the wire bonding regions 161 are formed on a plane different from the lands 140, an interval between the conductive wires 230 can be constantly maintained and the conductive wires 230 can have different traces, thus preventing a short between the conductive wires 230 due to wire sweeping in an encapsulation process.

Figure 5E:
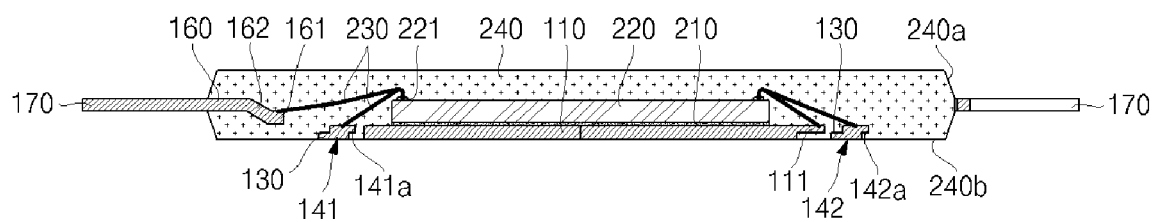
Figure 5F:
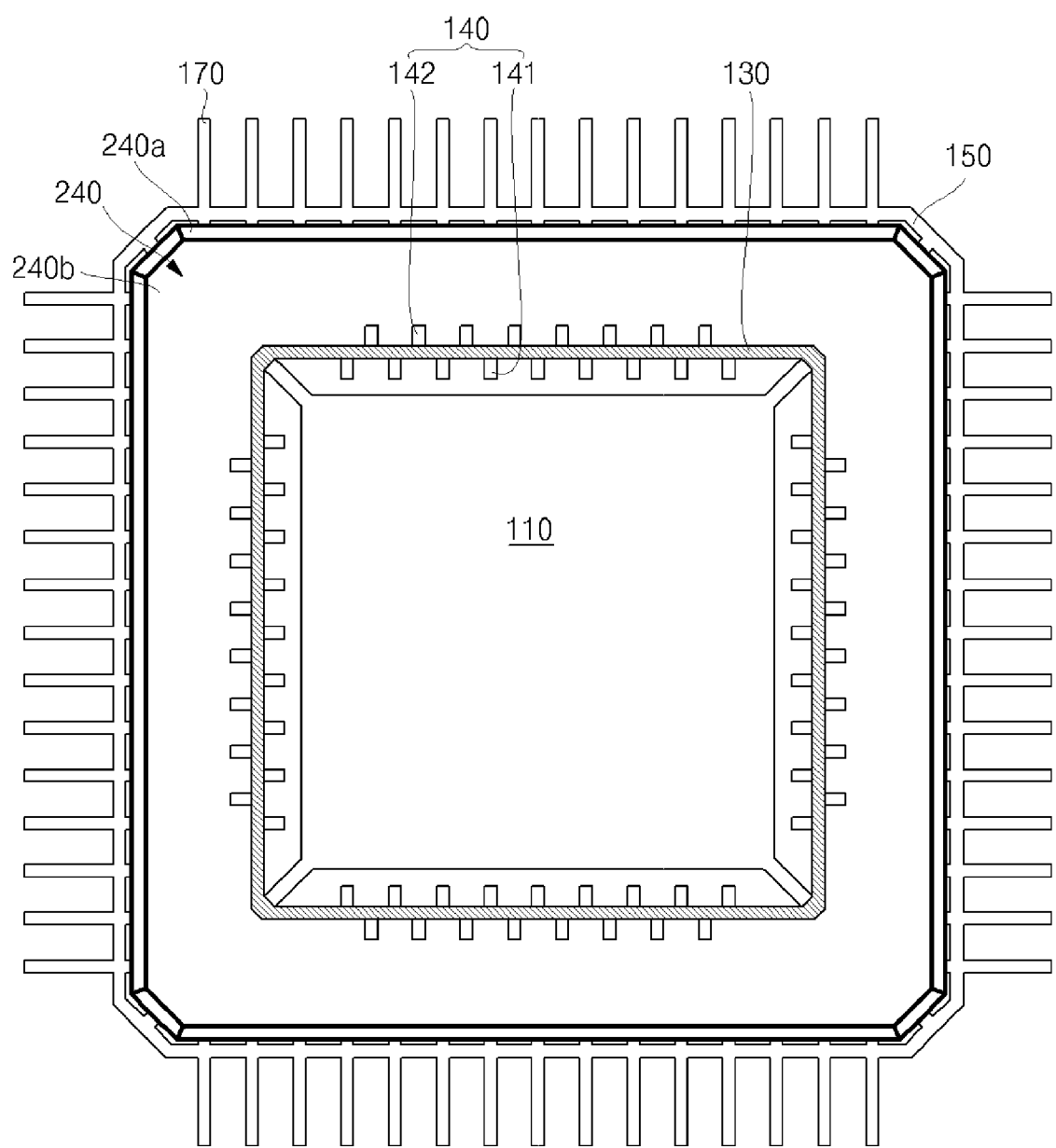

As shown in FIGS. 4, 5E and 5F, in the encapsulation step (S4), the lead frame 100, the adhesive 210, the semiconductor die 220 and the conductive wires 230 are encapsulated using the encapsulant 240 which defines a package body of the semiconductor device 200. The encapsulation is performed only in an inner region of the dambar 150 formed in the lead frame 100. That is, the dambar 150 and the second portions 170 of the leads are exposed to the outside through a side portion 240a of the encapsulant 240. The encapsulation step (S4) is performed to expose a lower surface of the die pad 110, some regions of the tie bars 120 connected to the die pad 110, the land connecting bar 130 connected to the tie bars 120, and the first and second lands 141 and 142 connected to the land connecting bar 130 in the lead frame 100.

Figure 5G:
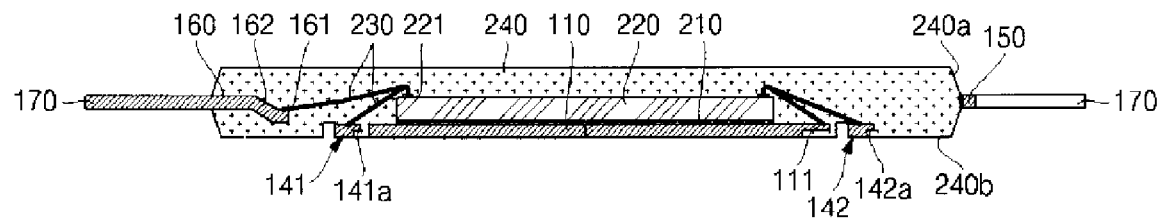
Figure 5H:
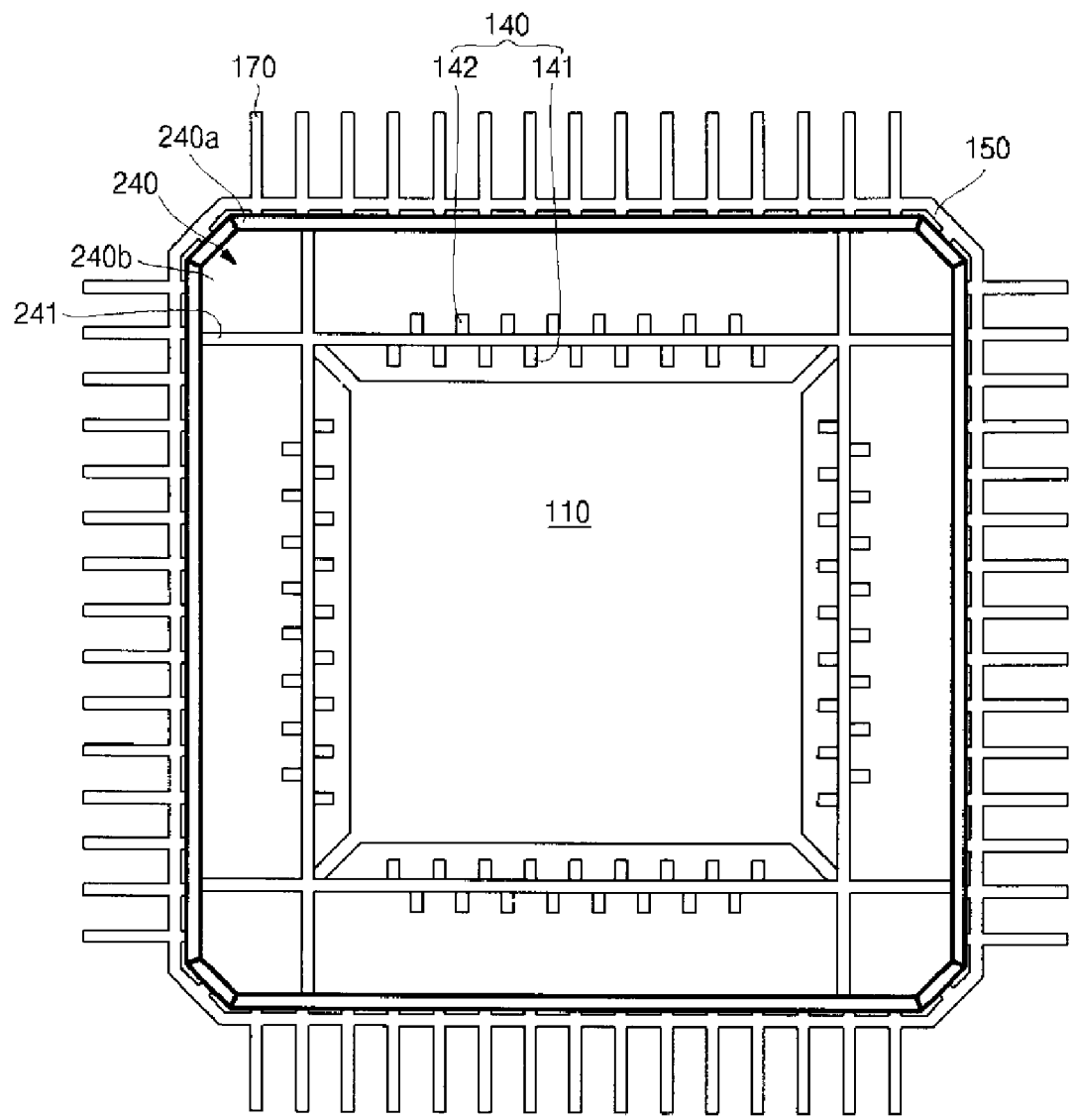

As shown in FIGS. 4, 5G and 5H, in the land connecting bar sawing step (S5), the land connecting bar 130 is ground and removed using a blade. That is, the land connecting bar 130 is removed, and a groove 241 of the encapsulant 240 is formed as a result of the removal of the land connecting bar 130. Thus, the first and second lands 141 and 142 connected to the land connecting bar 130 can be electrically isolated from one another.

Figure 5I:
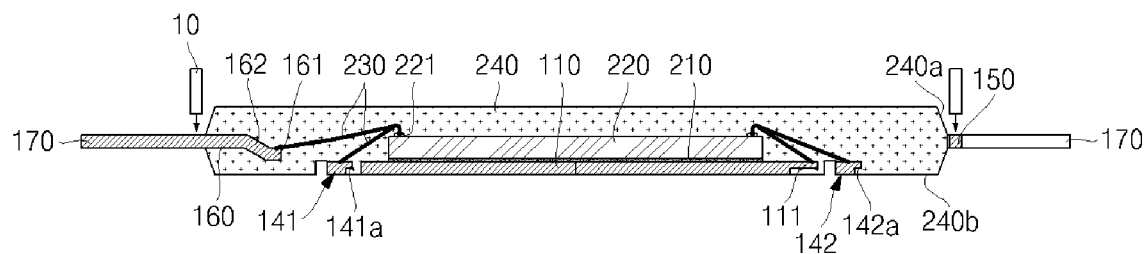
Figure 5J:
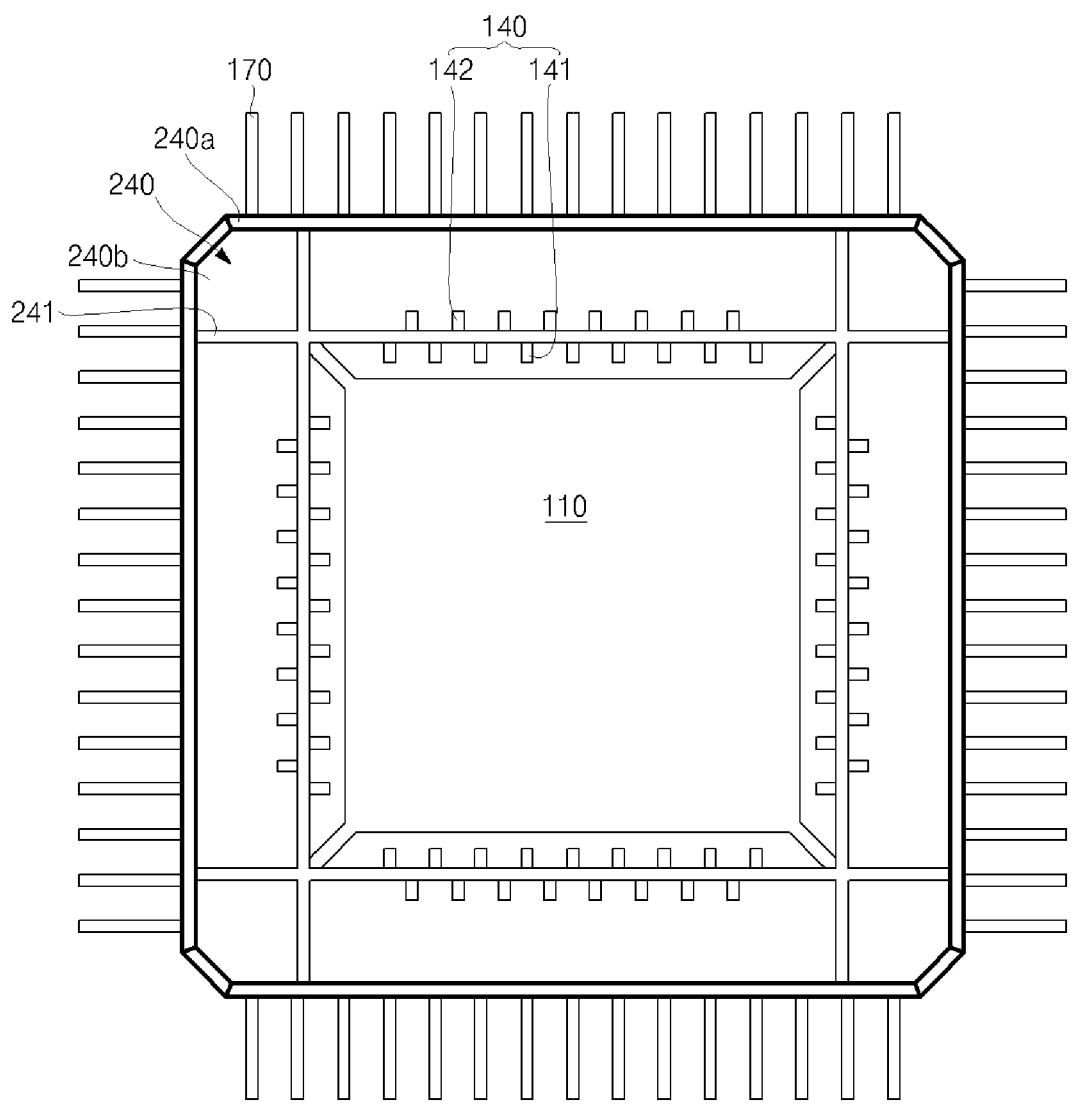

As shown in FIGS. 4, 5I and 5J, in the dambar cutting step (S6), the tie bars 120, and portions of the dambar 150 extending between the leads are cut and removed, so that the leads (which each include the first and second portions 160, 170) are electrically isolated from one another. That is, the intervening portions of the dambar 150 positioned outside the encapsulant 240 is cut and removed using a dambar cutting tool 10. In addition, all portions of the tie bars 120 protruding from the side portion 240a of the encapsulant 240 are removed in the dambar cutting step (S6).

Figure 5K:
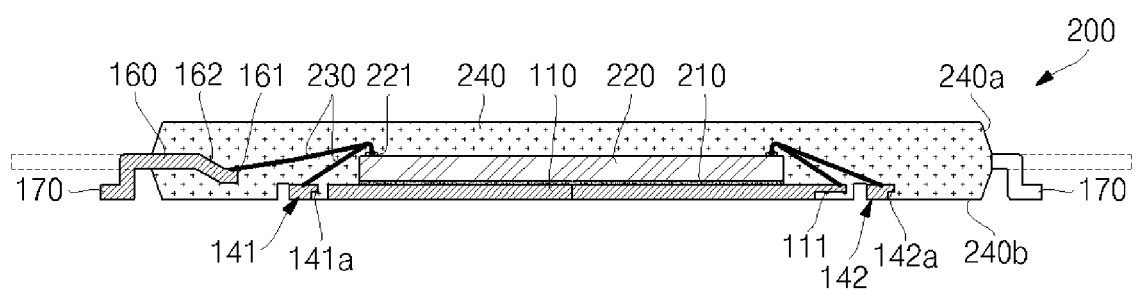

As shown in FIGS. 4 and 5K, in the lead forming step (S7), the second portions 170 of the leads protruding to the outside through the encapsulant 240 are formed in a predetermined shape. That is, the second portions 170 positioned at the side portion 240a of the encapsulant 240 are formed in a predetermined shape using a lead forming tool (not shown) such that the second portions 170 can be mounted on an external device. Although the second portions 170 are formed outwardly from the encapsulant 240, they may be formed inwardly from the encapsulant 240 as indicated above.

After the encapsulation step (S4), the land connecting bar sawing step (S5), the dambar cutting step (S6) or the lead forming step (S7), ink marking or laser marking may be performed with respect to a surface of the encapsulant 240. In addition, after the encapsulation step (S4), the land connecting bar sawing step (S5), the dambar cutting step (S6) or the lead forming step (S7), gold, silver, solder or the like is plated onto the second portions 170 of the leads and lands 140 exposed to the outside of the encapsulant 240, so that mounting can be easily performed with respect to an external device.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a lead frame including:
      a die pad;
      a plurality of first lands arranged to extend at least partially about the die pad;
      a plurality of second lands arranged to extend at least partially about the die pad such that the first lands are disposed between the die pad and the second lands, each of the second lands being offset relative to a respective one of the first lands; and
      a plurality of leads which each include a first portion and a second portion, the leads being arranged to extend at least partially about the die pad such that the first and second lands are disposed between the die pad and the first portions, each of the first portions being offset relative to a respective one of the second lands and generally aligned with a respective one of the first lands;
   a semiconductor die attached to the die pad and electrically connected to at least one of each of the first and second lands and the leads; and
   an encapsulant for encapsulating the lead frame and the semiconductor die such that portions of the second portions of the leads protrude from a side portion of the encapsulant and the first and second lands are each exposed in a lower surface of the encapsulant.

2. The semiconductor device of claim 1 wherein the semiconductor die is electrically connected to at least one of each of the first and second lands and the leads by conductive wires which are covered by the encapsulant.

3. The semiconductor device of claim 2 wherein the first portions of at least some of the leads each include a downset formed therein and covered by the encapsulant.

4. The semiconductor device of claim 3 wherein the first portions of the leads including a downset further define of wire bonding zone which is disposed between the downset and the die pad.

5. The semiconductor device of claim 4 wherein the die pad and the first and second lands extend along a first plane, and the wire bond zones of the first portions of the leads extend along a second plane which is disposed in spaced, generally parallel relation to the first plane.

6. The semiconductor device of claim 5 wherein the second portions of the leads extend along a third plane which is disposed in spaced, generally parallel relation to the second plane such that second plane extends between the first and third planes.

7. The semiconductor device of claim 1 wherein:
   each of the first lands includes a locking projection which is covered by the encapsulant; and
   each of the seconds lands includes a locking projection which is covered by the encapsulant.

8. The semiconductor device of claim 7 wherein:
   each of the first lands defines a lower surface, and the locking projection of each of the first lands is defined by a half-etched portion formed within the lower surface thereof; and each of the second lands defines a lower surface, and the locking projection of each of the second lands is defined by a half-etched portion formed within the lower surface thereof.

9. The semiconductor device of claim 8 wherein:

each of the first lands includes an end portion, with the locking projection of each of the first lands being disposed within the end portion thereof; and each of the second lands includes an end portion, with the locking projection of each of the second lands being disposed within the end portion thereof.

10. The semiconductor device of claim 1 wherein the die pad has a generally quadrangular configuration, and the first and second lands, and the leads are segregated into at least four sets which each extend along a respective one of the peripheral edge segments of the die pad.

11. The semiconductor device of claim 1 wherein the portions of the second portions of the leads which protrude from the side portion of the encapsulant are bent to assume a gull-wing configuration.

12. A semiconductor device comprising:

a die pad;

a plurality of first lands arranged to extend at least partially about the die pad;

a plurality of second lands arranged to extend at least partially about the die pad such that the first lands are disposed between the die pad and the second lands;

a plurality of leads which each include a first portion and a second portion, at least some of the first portions of at least some of the leads each including a downset formed therein, the leads being arranged to extend at least partially about the die pad such that the first and second lands are disposed between the die pad and the first portions of the leads;

a semiconductor die attached to the die pad and electrically connected to at least one of each of the first and second lands and the leads; and an encapsulant for encapsulating the lead frame and the semiconductor die such that portions of the second portions of the leads protrude from a side portion of the encapsulant, each downset is covered by the encapsulant, and the first and second lands are each exposed in a lower surface of the encapsulant.

13. The semiconductor device of claim 12 wherein the semiconductor die is electrically connected to at least one of each of the first and second lands and the leads by conductive wires which are covered by the encapsulant.

14. The semiconductor device of claim 13 wherein the first portions of the leads including a downset further define of wire bonding zone which is disposed between the downset and the die pad.

15. The semiconductor device of claim 14 wherein the die pad and the first and second lands extend along a first plane, the wire bond zones of the first portions of the leads extend along a second plane which is disposed in spaced, generally parallel relation to the first plane, and the second portions of the leads extend along a third plane which is disposed in spaced, generally parallel relation to the second plane such that second plane extends between the first and third planes.

16. The semiconductor device of claim 12 wherein the portions of the second portions of the leads which protrude from the side portion of the encapsulant are bent to assume a gull-wing configuration.

17. The semiconductor device of claim 12 wherein:

each of the first lands includes a locking projection which is covered by the encapsulant; and each of the seconds lands includes a locking projection which is covered by the encapsulant.

18. The semiconductor device of claim 17 wherein:

each of the first lands includes a lower surface and an end portion, and the locking projection of each of the first lands is defined by a half-etched portion formed within the lower surface at the end portion thereof; and each of the second lands includes a lower surface and an end portion, and the locking projection of each of the second lands is defined by a half-etched portion formed within the lower surface at the end portion thereof.

19. A semiconductor device comprising:

a die pad;

a plurality of first lands disposed in spaced relation to the die pad;

a plurality of second lands disposed in spaced relation to and offset relative to respective ones of the first lands; and a plurality of leads which each include a first portion and a second portion, the first portions of the leads being disposed in spaced relation to and offset relative to respective ones of the second lands and generally aligned with respective ones of the first lands;

a semiconductor die attached to the die pad and electrically connected to at least one of each of the first and second lands and the leads; and an encapsulant for encapsulating the lead frame and the semiconductor die such that portions of the second portions of the leads protrude from a side portion of the encapsulant and the first and second lands are each exposed in a lower surface of the encapsulant.

20. A semiconductor device comprising:

a die pad;

a plurality of first lands arranged to extend at least partially about the die pad, each of the first lands including a locking projection;

a plurality of second lands arranged to extend at least partially about the die pad such that the first lands are disposed between the die pad and the second lands, each of the second lands including a locking projection;

a plurality of leads which each include a first portion and a second portion, the leads being arranged to extend at least partially about the die pad such that the first and second lands are disposed between the die pad and the first portions of the leads;

a semiconductor die attached to the die pad and electrically connected to at least one of each of the first and second lands and the leads; and an encapsulant for encapsulating the lead frame and the semiconductor die such that portions of the second portions of the leads protrude from a side portion of the encapsulant, the locking projections of the first and second lands are covered by the encapsulant, and the first and second lands are each exposed in a lower surface of the encapsulant.

21. The semiconductor device of claim 20 wherein:

each of the first lands includes a lower surface and an end portion, and the locking projection of each of the first lands is defined by a half-etched portion formed within the lower surface at the end portion thereof; and each of the second lands includes a lower surface and an end portion, and the locking projection of each of the second lands is defined by a half-etched portion formed within the lower surface at the end portion thereof.

* * * * *